United States Patent
Brandt et al.

(10) Patent No.: US 8,208,243 B2
(45) Date of Patent: Jun. 26, 2012

(54) ELECTRICAL SWITCHGEAR PROVIDING IMPROVED INFRARED PREDICTIVE/PREVENTIVE MAINTENANCE

(75) Inventors: David D. Brandt, New Berlin, WI (US); David B. Jensen, Barneveld, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 672 days.

(21) Appl. No.: 12/241,845

(22) Filed: Sep. 30, 2008

(65) Prior Publication Data
US 2010/0079973 A1 Apr. 1, 2010

(51) Int. Cl.
*H02B 5/00* (2006.01)
*H02B 1/20* (2006.01)

(52) U.S. Cl. .......................... 361/605; 361/611; 361/612

(58) Field of Classification Search .................. None
See application file for complete search history.

(56) References Cited

U.S. PATENT DOCUMENTS

| | | | | |
|---|---|---|---|---|
| 5,805,813 A | * | 9/1998 | Schweitzer, III | 709/217 |
| 5,987,205 A | * | 11/1999 | Moseley et al. | 385/125 |
| 6,697,247 B1 | * | 2/2004 | Meinherz et al. | 361/115 |
| 7,312,911 B2 | * | 12/2007 | Tan et al. | 359/204.3 |
| 7,528,372 B2 | * | 5/2009 | Garvey et al. | 250/330 |
| 7,692,880 B2 | * | 4/2010 | Janicke | 359/810 |

* cited by examiner

*Primary Examiner* — Boris Chervinsky
(74) *Attorney, Agent, or Firm* — Boyle Fredrickson, S.C.; Alexander Kuszewski; John M. Miller

(57) ABSTRACT

One or more infrared transmitting ports are placed in the insulating housing of standard switchgear components to allow far infrared viewing of internal conductive components permitting earlier and more precise location of possible thermal failure through thermographic monitoring.

20 Claims, 3 Drawing Sheets

ELECTRICAL SWITCHGEAR PROVIDING IMPROVED INFRARED PREDICTIVE/PREVENTIVE MAINTENANCE

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates generally to thermographic monitoring of electrical equipment and, in particular, to electrical switchgear allowing improved thermographic monitoring.

Preventive and predictive maintenance techniques provide for the monitoring of equipment to avoid costly repair and lost production associated with unexpected equipment failures. Preventive maintenance institutes regularly scheduled monitoring of electrical, equipment, component replacement, and minor repairs. Predictive maintenance uses monitored data to more accurately assess maintenance scheduling and equipment replacement.

Thermographic monitoring employs cameras that are sensitive in the far infrared region (typically 3-15 µm) to provide non-contact thermal measurement of surface temperatures of equipment. Particularly for electronic equipment such thermographic images may provide advanced warning of equipment failure that would not otherwise be apparent. High temperatures may indicate, for example, high resistance electrical junctions, overvoltage or overcurrent, damaged insulation or damaged conductors that may ultimately lead to catastrophic failure. A thermographic image can be taken while the equipment is in operation with minimal operator risk. A thermographic image can encompass multiple equipment components allowing rapid monitoring of many potential failure points.

Electrical switchgear, such as contactors and the like, is typically encased in a housing of electrically insulating, fire retardant material intended to protect users from electrical arcing and high voltages, as well as to protect internal components of the switchgear from external contamination. The materials from which such housings are constructed must meet a demanding set of requirements including: high temperature resistance, high tensile strength, high flexural modulus, low warpage, good dimensional stability, and low moisture absorption. The need to encase the electrical components of the switchgear in such materials can limit the effectiveness of thermographic monitoring of switchgear, requiring substantial rise in the temperature of the housing before a thermographic image can be obtained.

SUMMARY OF THE INVENTION

The present inventors have recognized that the competing goals of switchgear housing design and thermographic imaging may be reconciled by the placement of infrared ports within the housing, for example, in the form of one or more light pipes aligned with critical components of the switchgear and passing through the housing. By limiting the size of the ports, infrared transmission may be optimized without compromising the mechanical strength or protective qualities of the switchgear housing.

Specifically then, the present invention provides an electrical switchgear component having an electrically insulating and flame retardant housing holding at least one electrical conducting element for conducting electrical currents therethrough. The housing provides at least one electrically insulating optical element substantially transparent to infrared energy in the range of 3-15 µm, the optical element having a first end within the housing receiving infrared light from heating of the electrical conducting element and a second end passing through the housing to be visible from outside of the housing.

It is thus an object of the invention to provide an improved switchgear housing amenable to thermographic monitoring.

The optical element may be a thermoplastic material.

It is thus another object of the invention to provide a housing constructed of materials that may be readily fabricated in parallel with the other elements of the switchgear.

The housing may be generally rectangular having a first surface for mounting against a cabinet wall and wherein the optical element passes through a second surface opposite the first surface.

It is thus an object of the invention to transmit important thermographic information on a single readily viewable face of the switchgear.

The housing may include a second electrically insulating optical element transmitting infrared energy in the range of 3-15 µm having a first end within the housing receiving infrared light from heating of the electrical conducting element and having a second end passing through a second surface perpendicular to the first surface.

It is thus an object of the invention to permit switchgear to be mounted on the rear or side panel of a conventional metal cabinet.

The optical element may be constructed of two separate light conductive channels of different materials having different infrared energy transmission characteristics.

It is thus an object of the invention to provide for a broad-spectrum infrared port using commonly available thermoplastic materials.

The optical element is curved to conduct infrared energy by means of internal reflections.

It is thus an object of the invention to provide for light pipes allowing convenient transmission of infrared energy to observation points.

The electrical conducting element is a conductive metal bar or alternatively an electrical coil forming part of an electromechanical relay.

It is thus an object of the invention to allow improved monitoring of critical switch elements.

The first end of the optical element includes a lens focusing light from the electrical conducting element. The lens may be a Fresnel lens.

It is thus an object of the invention to provide light collecting capabilities improving the sensitivity of the thermographic monitoring process.

The second end of the optical element provides a diffuser.

It is thus another object of the invention to provide improved imaging acquisition angles for the infrared energy.

The switchgear may further include an infrared mirror positioned between the optical element and the electrical conducting element.

It is thus another object of the invention to permit substantial optical path lengths with minimal infrared attenuation.

The switchgear may comprise: circuit breakers, disconnects, contactors, overload relays, switches and motor starters.

It is thus an object of the invention to provide a technique suitable for common power devices where thermographic monitoring would prove useful.

These particular objects and advantages may apply to only some embodiments falling within the claims and thus do not define the scope of the invention.

DETAILED DESCRIPTION OF THE PREFERRED EMBODIMENT

Figure 1:
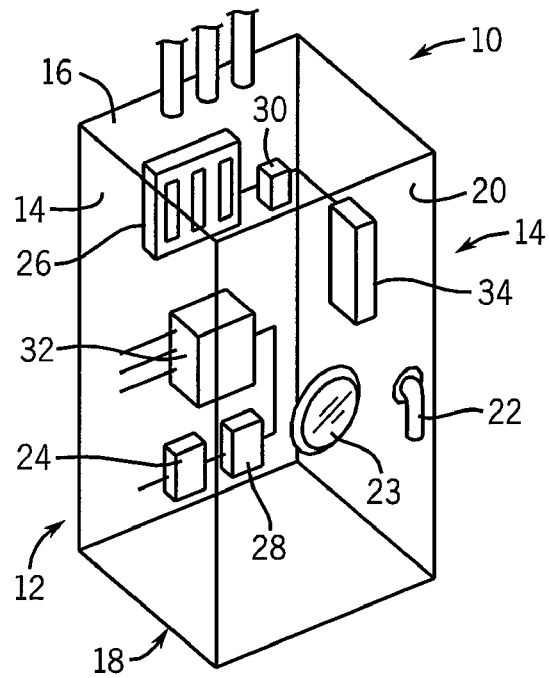
FIG. 1 is a perspective view, in phantom, of a standard electrical cabinet holding switchgear components, the cabinet having an infrared port for thermographic monitoring of the switchgear components.

Referring now to FIG. 1, a switchgear cabinet 10 may provide a rear vertical wall 12 surrounded by forwardly extending sidewalls 14, top wall 16 and bottom wall 18 to provide a protected volume enclosed by front door 20 opposite the rear vertical wall 12. Typically the cabinet 10 is constructed of steel panels to provide a strong and fire resistant enclosure.

The front door 20 may be opened and closed for access to the enclosed volume in the cabinet 10 by means of a handle 22 which may turn to lock the cabinet and which may be connected to an electrical interlock or the like. The door 20 may support a port 23 providing either an infrared transparent window or an openable shutter allowing viewing of internal components by a thermographic camera (not shown) while providing maximum protection to the camera operator.

The cabinet 10 may include multiple switchgear components including, for example: circuit breakers 24, disconnect 26, contactors 28, over-load relays 30, motor starters 32, and switches 34. While such switchgear is typically electromechanical, the present invention also contemplates switchgear providing the same functionality using solid-state, semiconducting, elements such as silicon-controlled rectifiers (SCRs). The switchgear components are characterized by having internal conductors rated for handling powers in excess of 100 volt-amperes such as present a potential of destructive electrical overheating. The switchgear components 24-34 may be mounted on the rear vertical wall 12 or on the sidewalls 14 to be, ideally, within an inspection cone defined by the port 23.

Figure 2:
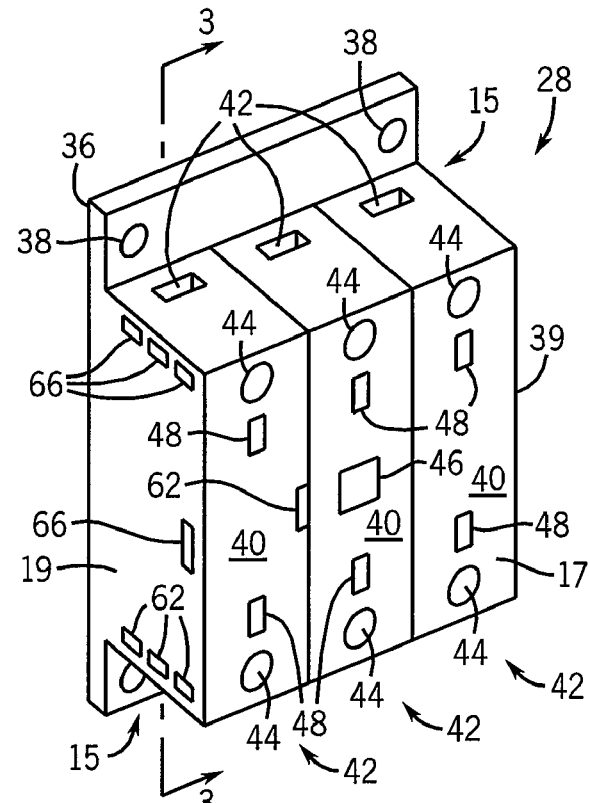
FIG. 2 is a perspective view of a switchgear component such as may be installed in the cabinet of FIG. 1 showing the addition of infrared ports for monitoring internal temperatures.

Referring now to FIG. 2, an example switchgear component of contactor 28 provides for a mounting flange 36 having mounting holes 38 for mounting the flange 36 against the rear vertical wall 12 or sidewalls of the cabinet 10. The flange 36 may form part of a contactor housing 39, the housing being generally rectangular. The contactor 28 may provide for multiple internal contact sets 40 each presenting screw terminals 42 to receive wiring through the top and bottom surfaces 15 of the contactor 28, with the screw terminals accessible for tightening through apertures 44 in a front surface 17 of the contactor 28. The apertures 44 are constructed to minimize the possibility of contamination entering into the housing 39.

Figure 3:
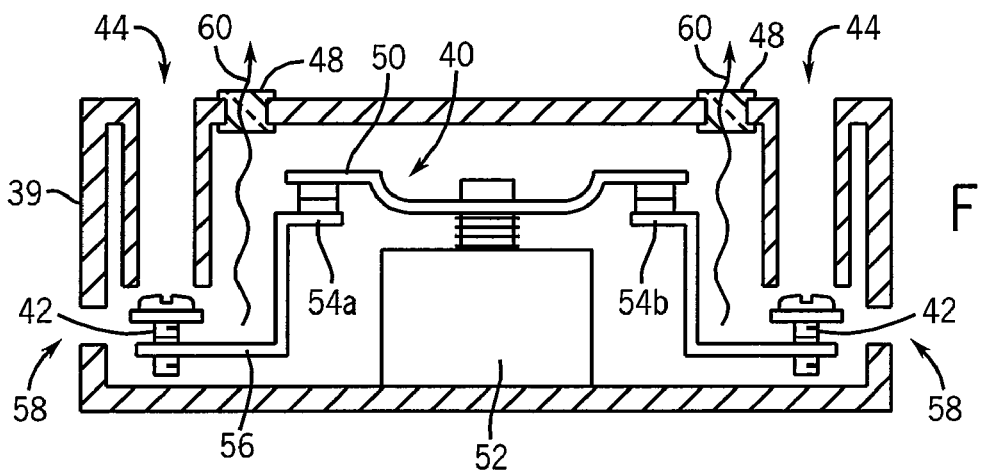
FIG. 3 is a cross-sectional view along lines 3-3 of FIG. 2 showing placement of infrared ports for monitoring internal conductors.

A central window 46 in the front surface 17 of the contactor 28 passing light in the visible spectrum may be used to reveal the position of a contact bar 50 associated with an internal solenoid 52 (both shown in FIG. 3).

Generally, the present invention adds a series of infrared transmitting infrared ports 48 to the housing 39 to permit the optical transmission of far infrared (3-15 μm) radiation from inside the housing 39 to one or more points visible outside the housing 39. The infrared ports 48 thus preserve the integrity of the housing 39 in preventing the ingress of contamination (in contrast to a hole). The infrared ports 48 may be exposed through a front surface 17 of the housing 39 opposite the flange 36 or through one or both side surfaces 19 perpendicular to the flange 36 allowing for the mounting of the contactor 28 on either the rear vertical wall 12 or sidewalls 14 while still allowing the portions of the infrared ports 48 exposed through the housing 39 to be visible through the port 23 on door 20 of the switchgear cabinet 10. The infrared ports 48 may provide a wider viewing angle than a simple aperture, for example, by having a properly shaped outer surface to redirect the thermal energy over a wider viewing angle by prismatic or diffusing elements.

Referring now to FIG. 3, each contact set 40 may have a movable contact bar 50 attached to a solenoid 52 to move toward and away (and thus to connect with and disconnect from) internal stationary contacts 54a and 54b. The internal stationary contacts 54a and 54b in turn may connect through conductor 56 with corresponding screw terminals 42. As noted above, typically the screw terminals 42, will receive wiring through apertures 58 in the top or bottom surfaces 15 of the housing 39. Generally, the apertures 58 are sized so that they are largely filled by the wiring received by terminals 42 preventing the ingress of dirt or environmental contamination.

Portions of the conductors 56 are aligned beneath infrared ports 48 on the front surface 17 of the housing 39 allowing infrared energy 60 in the far infrared region to pass therethrough. Monitoring the temperature of the conductors 56 provides a measure of the temperature both of the screw terminals 42 and the contacts 54 by means of high thermal conduction through the conductors 56. Alternatively, but not shown, infrared ports 48 may be aligned directly with the contacts 54 or screw terminals 42.

The infrared ports 48 may be constructed of a thermoplastic that provides for a high degree of transmission in the far infrared region. Generally such plastics do not meet the requirements of the material of the housing 39, but their limited area permits them to be included in the housing 39 without significantly compromising the structural characteristics of that housing 39. Plastic material suitable for use in this application, for example, may be commercially available from Fresnel Technologies Inc. of Fort Worth, Tex. under the trade names of Poly IR. In certain applications other materials providing far infrared transmission may also be used, including for example synthetic sapphire (Al2O3) or quartz (SiO2).

The infrared ports 48 may be snapped into place in a completed housing 39, co-molded with the housing 39, glued in place, or held under an installed flange according to techniques well known in the art.

Figure 4:
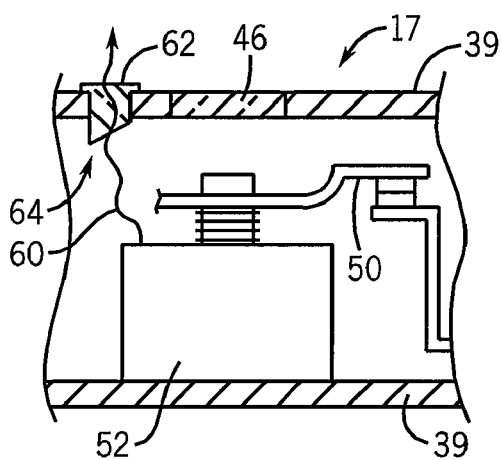
FIG. 4 is a fragmentary view similar to that of FIG. 3 showing a port for monitoring a solenoid coil in a contactor.

Referring now to FIG. 4, in an optional embodiment, an infrared light pipe 62 may be provided in the front surface 17 having a canted end 64 allowing the infrared light pipe 62 to be laterally displaced from its target (in this case internal solenoid 52) while providing for the collection of infrared energy 60 from the internal solenoid 52 itself. In this way, the collection of infrared energy may be had without interference with the central window 46, previously described, providing a view of the contact bar 50 in the visible spectrum.

Figure 5:
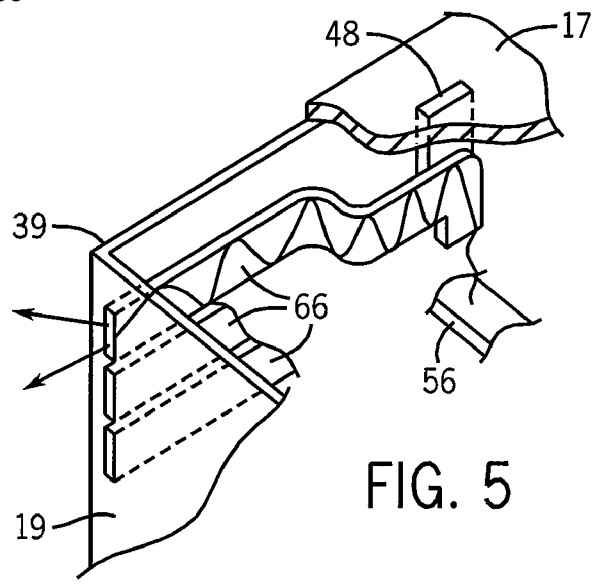
FIG. 5 is a perspective fragmentary view of a corner of the switchgear component of FIG. 2 showing the use of light pipes allowing thermographic monitoring from a front and side surface of the switchgear component.

Referring now to FIG. 5, infrared ports 48 exposed at the front surface 17 of the contactor 28 may be supplemented with light pipes 66 laterally conducting far infrared light, for example, from conductors 56 to a side surface 19. The light pipes 66 may employ internal reflection to conduct light to an arbitrary location on the side surface 19 over a curved optical path.

Figure 6:
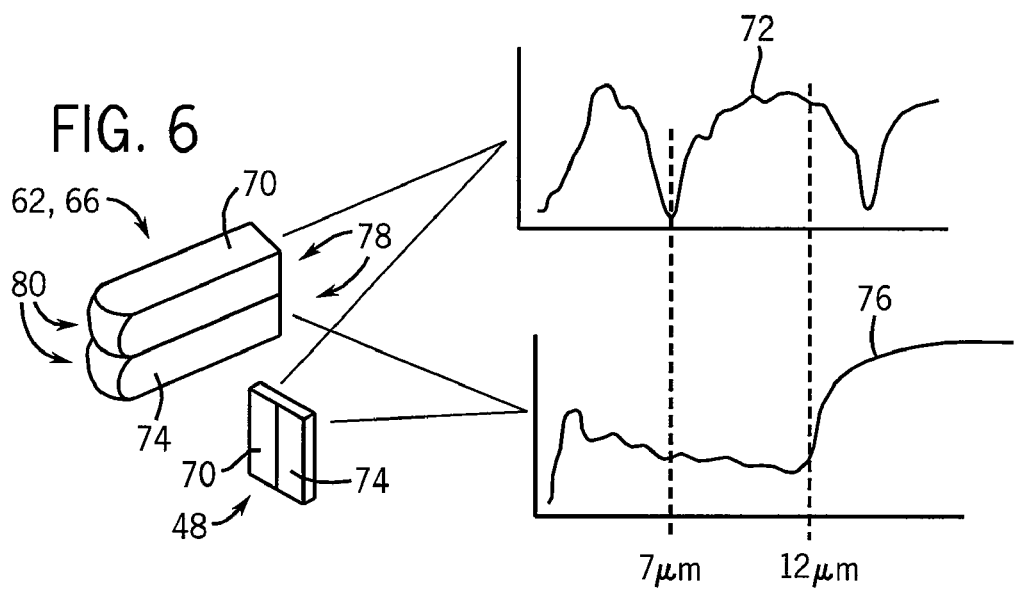
FIG. 6 is a perspective view of a light pipe and a window formed from multiple materials to optimize infrared transmission range, the light pipe further providing a lens surface and diffuser surface.

Referring now to FIG. 6, conveniently, the optical elements comprising the infrared ports 48 and infrared light pipes 62 and 66 may be constructed of multiple different polymer materials to pass a broad transmission spectrum. For example the infrared optical elements of infrared ports 48 and infrared light pipes 62 and 66 may have a portion constructed of a first polymer 70 having a spectrum 72 providing, for example, substantial transparency in a range of 7-12 μm and a second polymer 74 having substantial transparency beyond 12 μm as indicated by spectrum 76. In this way, the optical elements of infrared ports 48, and infrared light pipes 62 and 66 may be manufactured using common manufacturing techniques while still providing for broad spectral transmission useful for optical thermography.

The optical elements of infrared ports 48 and infrared light pipes 62 and 66 may have an outer roughened surface 78 providing a diffuser facing out of the housing 39 to allow for a range of viewing angles of the exposed ends of the infrared ports 48 and infrared light pipes 62 and 66 and an inner lens 80 designed to provide for improved acquisition of infrared energy from a target inside the housing.

Figure 7:
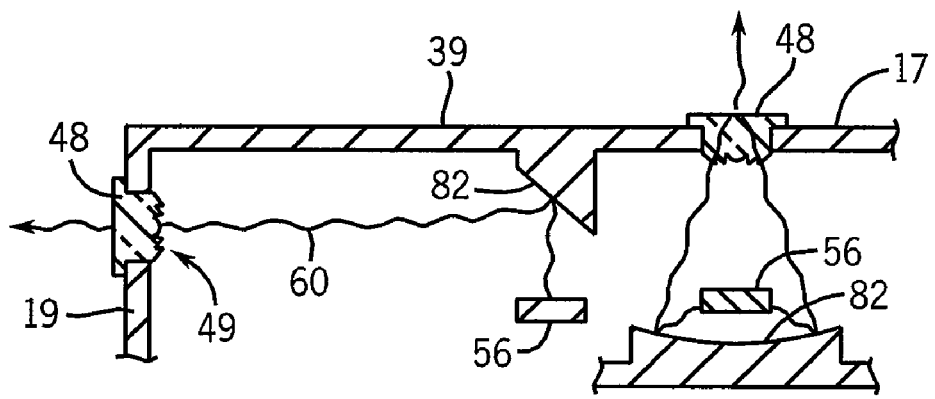
FIG. 7 is a fragmentary view similar to that of FIG. 3 showing the use of an infrared mirror and Fresnel lens for optimizing infrared transmission.

Referring now to FIG. 7, the high attenuation of polymer materials in the infrared range may be accommodated for a long optical path through the use of a front surface infrared mirror 82, for example being metallized plastic, providing for free space transmission of infrared energy 60. The infrared mirror 82 may be a planar mirror positioned on an inner surface of the front surface 17 to reflect light at an angle from the conductors 56 to an infrared port 48 on the side surface 19. The optical port may include a Fresnel lens 49 focused through an infrared mirror 82 on conductor 56 to reject infrared light from other surfaces and thus to provide for selectivity. Alternatively, the infrared mirror 82 may be a concave mirror positioned beneath the conductor 56 to focus light on an opposed infrared port 48.

Figure 8:
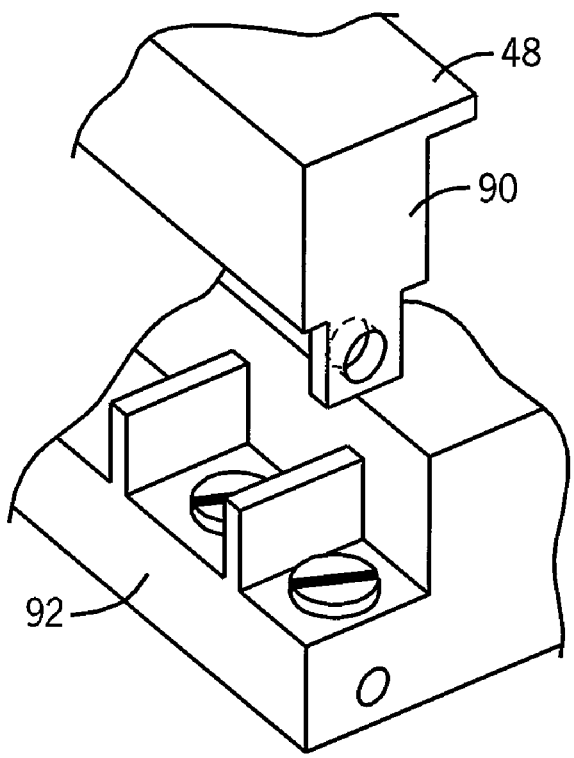
FIG. 8 is a fragmentary perspective view of an alternative embodiment of the invention with a terminal block cover constructed of infrared transparent material.

Referring now to FIG. 8, the present invention contemplates that the optical elements may also be implemented as protective covers 90 composed entirely or predominantly of infrared transparent material and that may fit over, for example, terminal blocks 92 associated with switchgear and the like.

The present invention has been described in terms of the preferred embodiment, and it is recognized that equivalents, alternatives, and modifications, aside from those expressly stated, are possible and within the scope of the appending claims.

We claim:

1. An electrical switchgear component comprising:
   an electrically insulating and flame retardant housing having means for mounting the housing on a panel of a protective enclosure having openings that are gas permeable;
   at least one electrical conducting element contained within the housing for conducting electrical currents therethrough, the electrical conducting element being substantially stationary with respect to the housing;
   at least one electrically insulating optical element substantially transparent to infrared energy having a first end within the housing receiving infrared light in a range of 3-15 μm from heating of the electrical conducting element and a second end passing through the housing to be visible from outside of the housing; the optical element positioned within the housing and adapted to receive and conduct infrared light substantially only from material stationary with respect to the housing and positioned and adapted to allow passage of that light to a remote thermographic camera.

2. The electrical switchgear component of claim 1 wherein the optical element is a thermoplastic material providing transmission of infrared energy permitting temperature measurement of the at least one electrical conducting element from the transmitted infrared light.

3. The electrical switchgear component of claim 1 wherein the housing is generally rectangular having a first surface for mounting against a cabinet wall and wherein the optical element passes through a second surface opposite the first surface.

4. The electrical switchgear component of claim 3 further including a second electrically insulating optical element transmitting infrared energy in the range of 3-15 μm having a first end within the housing receiving infrared light from heating of the electrical conducting element and having a second end passing through a second surface perpendicular to first surface.

5. The electrical switchgear component of claim 1 wherein the housing is generally rectangular having a first surface for mounting against a cabinet wall and wherein the optical element passes through a second surface perpendicular to the first surface.

6. The electrical switchgear component of claim 1 wherein the optical element is curved to conduct infrared energy by means of internal reflections.

7. The electrical switchgear component of claim 1 wherein the electrical conducting element is a conductive metal bar.

8. The electrical switchgear component of claim 1 wherein the electrical conducting element is a solid-state, semiconductor element.

9. The electrical switchgear component of claim 1 wherein the electrical conducting element is an electrical coil forming part of an electromechanical relay.

10. The electrical switchgear component of claim 1 wherein the first end of the optical element includes a lens focusing light from the electrical conducting element.

11. The electrical switchgear component of claim 10 wherein the lens is a Fresnel lens.

12. The electrical switchgear component of claim 1 wherein the second end of the optical element provides a diffuser.

13. The electrical switchgear component of claim 1 further including an infrared mirror positioned between the optical element and the electrical conducting element.

14. The electrical switchgear component of claim 1 wherein the electrical switchgear component is selected from the group consisting of:

circuit breakers, disconnects, contactors, overload relays, switches, and motor starters.

15. An electrical switchgear component comprising:

an electrically insulating and flame retardant housing having means for mounting the housing on a panel of a protective enclosure;

at least one electrical conducting element contained within the housing for conducting electrical currents therethrough and;

at least one electrically insulating optical element substantially transparent to infrared energy having a first end within the housing receiving infrared light from heating of the electrical conducting element and a second end passing through the housing to be visible from outside of the housing; the optical element positioned and adapted to receive and conduct infrared light substantially only from material stationary with respect to the housing;

wherein the optical element comprises two separate light conductive channels of different materials having different infrared energy transmission characteristics.

16. A method of manufacturing switchgear comprising the steps of:

(a) forming an electrically insulating and flame retardant housing having openings therethrough that are gas permeable;

(b) assembling at least one electrical conducting element within the housing for conducting electrical currents therethrough, the electrical conducting element being substantially stationary with respect to the housing;

(c) placing at least one electrically insulating optical element transmitting infrared energy in a range of 3-15 μm having a first end within the housing receiving infrared light from heating of the electrical conducting element and a second end passing through the housing to be visible from outside of the housing, the optical element positioned in the housing to receive infrared light substantially only from material stationary with respect to the housing and positioned and adapted to allow passage of that light to a remote thermographic camera;

wherein the infrared light is in a frequency range providing an indication of a temperature of the material.

17. The method of claim 16 further including the step of:

(d) monitoring operation of the switchgear in use by detecting infrared radiation emitted through the optical element.

18. An electrical switchgear component comprising:

an electrically insulating housing opaque to infrared energy in a range of 3-15 μm and having means for mounting the housing on a panel of a protective enclosure and having openings that are gas permeable;

a first and second terminal accessible from outside the housing;

an electrical switch element within the housing communicating between the first and second terminal; and at least one infrared transmitting port in the electrically insulating housing positioned in the housing to allow transmission of infrared light emitted from at least a portion of the electrical switch in a range of 3-15 μm to outside the protective enclosure for infrared thermography without formation of an image of the portion of the electric switch and positioned and adapted to allow passage of that light to a remote thermographic camera.

19. The electrical switchgear component of claim 18 wherein the housing is generally rectangular having a first surface for mounting against a cabinet wall and wherein the port allows viewing access from a position opposite the first surface.

20. The electrical switchgear component of claim 18 wherein the housing is generally rectangular having a first surface for mounting against a cabinet wall and wherein the port allows viewing access along an axis parallel to the first surface.

* * * * *